(12) United States Patent
Qian et al.

(10) Patent No.: US 12,374,523 B1
(45) Date of Patent: Jul. 29, 2025

(54) INTEGRATED FEEDTHROUGH FOR HIGH VOLTAGE CABLES

(71) Applicant: Hefei Comprehensive National Science Center Energy Research Institute(Anhui Energy Laboratory), Hefei (CN)

(72) Inventors: Yuzhong Qian, Hefei (CN); Zhenqing Zhu, Hefei (CN); Mengmeng Li, Hefei (CN); Lizhen Liang, Hefei (CN); Liangliang Wu, Hefei (CN); Xin Tao, Hefei (CN); Chundong Hu, Hefei (CN)

(73) Assignee: Hefei Comprehensive National Science Center Energy Research Institute(Anhui Energy Laboratory), Hefei (CN)

( * ) Notice: Subject to any disclaimer, the term of this patent is extended or adjusted under 35 U.S.C. 154(b) by 0 days.

(21) Appl. No.: 19/020,985

(22) Filed: Jan. 14, 2025

(30) Foreign Application Priority Data

Aug. 20, 2024 (CN) .......................... 202411140064.1

(51) Int. Cl.
| | | |
|---|---|---|
| *H01R 13/52* | (2006.01) | |
| *H01J 37/248* | (2006.01) | |
| *H01R 4/70* | (2006.01) | |
| *H01R 13/53* | (2006.01) | |
| *H05H 3/06* | (2006.01) | |

(52) U.S. Cl.
CPC ....... *H01J 37/248* (2013.01); *H01J 2237/166* (2013.01)

(58) Field of Classification Search
CPC .............. H01J 37/248; H01J 2237/166; H01R 13/5205; H01R 13/521; H01R 13/5216; H01R 13/53; H01R 13/52; H01R 4/70; H05H 3/06
USPC ........................................................ 174/650
See application file for complete search history.

(56) References Cited

U.S. PATENT DOCUMENTS

| | | | |
|---|---|---|---|
| 2010/0061500 A1* | 3/2010 | Lou ......................... | H05H 6/00 376/114 |
| 2011/0297440 A1 | 12/2011 | Gibbs et al. | |
| 2023/0238736 A1* | 7/2023 | Van Der Kroon ... | H01R 13/533 250/441.11 |

FOREIGN PATENT DOCUMENTS

| | | |
|---|---|---|
| CN | 103066467 A | 4/2013 |
| CN | 210806174 U | 6/2020 |

\* cited by examiner

*Primary Examiner* — Timothy J Thompson
*Assistant Examiner* — Guillermo J Egoavil
(74) *Attorney, Agent, or Firm* — Nitin Kaushik (57) ABSTRACT

The present disclosure provides an integrated feedthrough for high voltage cables, which belongs to the field of compact neutron generators and comprises a glue filling device composed of an upper clamping cover plate, a lower clamping cover plate, a high voltage joint, a compression collar and a compression nut, and a feedthrough composed of a feeder pillar, a high voltage joint, a high pressure sealing plug, an insulating glue, a high voltage cable, a compression collar, a compression nut, a flange, a seal ring, threaded rods, a pressing plate and nuts. According to the present disclosure, the high voltage joint and the high voltage cable are sealed with an insulating glue through a glue filling device, so as to realize insulation treatment of the high voltage cable fed into vacuum.

14 Claims, 5 Drawing Sheets

INTEGRATED FEEDTHROUGH FOR HIGH VOLTAGE CABLES

CROSS-REFERENCE TO RELATED APPLICATIONS

The application claims priority to Chinese patent application No. 202411140064.1, filed on Aug. 20, 2024, the entire contents of which are incorporated herein by reference.

TECHNICAL FIELD

The present disclosure belongs to the field of compact neutron generator, and in particular relates to an integrated feedthrough for high voltage cables.

BACKGROUND

Neutron technology has been widely used in all walks of life, especially in the medical field. It is often used to treat tumors, including using a neutron therapy system, a boron neutron capture therapy and a fast neutron radiation therapy. The application of neutron therapies represents one of the advanced technologies for treating tumors and provides hope for the treatment of tumors. Among them, deuterium-deuterium neutron generators are one of the most promising accelerator based neutron sources for miniaturization.

In a compact deuterium-deuterium neutron generator, the target high voltage power supply is one of its important components. The target high voltage power supply, also known as an accelerator high voltage power supply, provides negative high voltage required for ion acceleration, so that ions can obtain sufficient energy to bombard substances on a target and generate neutrons. The target high voltage power supply feeds negative high voltage to the target through cables. High voltage sparking should be avoided, while the feeding of target high voltage will directly affect the yield and stability of neutrons generated by a neutron generator. Therefore, it is urgent to insulate the high voltage cables fed into vacuum to avoid high voltage sparking.

SUMMARY

In order to solve the insulation problem of a high voltage feed line, the present disclosure provides an integrated feedthrough for high voltage cables, which effectively avoids the sparking problem caused by the high voltage feed line.

In order to achieve the above purpose, the following technical solution is adopted in the present disclosure:

An integrated feedthrough for high voltage cables is provided, comprising a glue filling device and a high voltage feedthrough;

The glue filling device is composed of a lower clamping cover plate, an upper clamping cover plate, a compression collar, a compression nut, a high voltage plug, a high voltage blind flange socket and a high voltage cable in a coordinated manner; the upper clamping cover plate and the lower clamping cover plate are connected by a second bolt, and a glue filling cavity is arranged inside; the high voltage blind flange socket cooperates with a tapered groove inside the high voltage plug and a thread structure outside through a W-shaped groove and a thread structure inside to form a high voltage joint; the glue filling cavity cooperates with the high voltage joint, the compression collar and the compression nut to seal both front and rear ends of the glue filling cavity to prevent the insulating glue from overflowing; after the insulating glue is allowed to stand for curing, the high voltage plug and the high voltage cable sealed by the insulating glue are taken out.

The high voltage feedthrough is composed of a high voltage plug, a high voltage blind flange socket, a high voltage cable, an insulating glue, a feeder pillar, a high voltage sealing plug, a compression collar and a compression nut in a coordinated manner. Firstly, both the high voltage plug and the high voltage cable sealed by the insulating glue are inserted into a tapered high pressure channel of the feeder pillar; secondly, the high voltage sealing plug is matched with the high voltage blind flange socket at an upper end of the feeder pillar, the two are fastened by a first bolt, and the compression collar is matched with the high voltage cable at a tail of the feeder pillar, the two are fastened by thread fitting at the tail of the feeder pillar through the compression nut. The flange is matched with the feeder pillar, the two are fastened by threaded rods, a pressing plate and nuts, and a seal ring between the flange and the feeder pillar is extruded to deform the seal ring and seal the vacuum fed by the feeder pillar; high voltage is fed into the target through the high voltage feedthrough to realize insulation and sealing of the high voltage plug and the high voltage cable and avoid high voltage sparking.

Further, the upper clamping cover plate and the lower clamping cover plate are made of stainless steel. The front ends of the upper clamping cover plate and the lower clamping cover plate are machined with cylinders and drilled with two symmetrical threaded holes. A semicircular groove and a tapered groove are formed inside the upper clamping cover plate and the lower clamping cover plate, and the semicircular groove and the tapered groove form a glue filling cavity; the upper clamping cover plate and the lower clamping cover plate are connected by a second bolt; two holes are arranged on an upper end face of the upper clamping cover plate, one hole is configured to exhaust air and discharge excessive insulating glue, and the other hole is configured to perform a glue filling operation; a rear end of the lower clamping cover plate is provided with a cylinder. A hole is opened in the cylinder, and threads are machined on an outer surface of the cylinder. When filling glue, the upper clamping cover plate and the lower clamping cover plate cooperate with the compression collar, compression nut and high voltage cable to play a sealing role.

Further, the compression collar is a round table made of fluororubber material, and a circular through hole is drilled in a middle area to let the high voltage cable pass through and be put into a corresponding groove; and the compression collar fills the groove to form a seal upon being extruded by pressure.

Further, the compression nut is made of stainless steel and has an L-shaped cross section.

Further, the high voltage plug is made of oxygen-free copper, with a conical head and a tapered groove in a central area of the head. A tail of the high voltage plug is machined with threads to be matched with the high voltage blind flange socket, while a circular hole slot is formed in a central area of the tail, and the high voltage cable is inserted into the circular hole slot and connected by tin soldering.

Further, the high voltage blind flange socket is a circular copper block made of oxygen-free copper and provided with an annular wrapping, the annular wrapping and the circular copper block form a culture dish structure; a cylindrical bulge is arranged in a central area at a bottom of the circular copper block, a groove with a W-shaped cross section is opened in a central area of the cylindrical bulge, and threads are machined at an entrance of the groove.

Further, the insulating glue is Tianmu 701, and Tianmu 701 insulates and seals the high voltage plug and the high voltage cable through the glue filling device.

Further, the glue filling device is fastened by the upper clamping cover plate and the lower clamping cover plate through the second bolt; a front end of the glue filling cavity is fastened with the high voltage joint in an interference fit through the first bolt; the compression collar is matched with the high voltage cable at a rear end of the glue filling cavity, and the two are fastened by thread fitting between the compression nut and a rear end of the lower clamping cover plate; the compression collar fills the groove by being extruded under pressure to form a conical seal, and a glue enters through a glue filling port. Excessive insulating glue and air inside the insulating glue are discharged through an exhaust pipe.

Further, the feeder pillar is made of polyether ether ketone (PEEK) material and the feeder pillar has a stepped shaft shape as a whole to prevent high voltage creepage arc. A tapered high pressure channel is drilled inside the feeder pillar, and through the tapered high pressure channel, the high voltage cable is fed into vacuum.

Further, the high voltage joint and the high voltage cable are taken out after being sealed with the insulating glue and allowed to stand for curing. The high voltage cable is fed into vacuum through a tapered high pressure channel, and both ends of the tapered high pressure channel are sealed by tapered compression.

Further, the flange is a circular block made of stainless steel, and a circular through hole is formed at a center position of the flange, so that the feeder pillar can be fed into vacuum through the circular through hole, and threaded holes are drilled around the circular through hole and circumferentially distributed.

Further, the seal ring is made of fluororubber material and has an O-shaped cross section.

Further, the pressing plate is a circular block made of PEEK material, and a circular through hole is drilled at the center position of the pressing plate so that the tail of the feeder pillar can pass through it. Through holes are drilled on an edge of the pressing plate and circumferentially distributed so that the threaded rod can pass through it.

Further, the threaded rod is made of PEEK material, and by fitting with the threaded holes on the flange and the pressing plate, and tightening nuts to extrude the seal ring between the flange and the feeder pillar to generate deformation, so as to seal with the vacuum fed in by the feeder pillar.

Beneficial Effects

1. The glue filling device seals a high voltage joint and a high voltage cable with an insulating glue to achieve the insulation effect. An upper clamping cover plate is designed with a glue filling port and an exhaust pipe, which can facilitate the glue filling operation and discharge air inside the insulating glue.

2. For a high voltage feedthrough, the feeder pillar is made of PEEK material to insulate the high voltage cable, which can effectively avoid the problem of high voltage sparking. The upper and lower ends of the feeder pillar are tapered seals, which can compress the glue and the high voltage cable to avoid gaps inside the high pressure channel and achieve better insulation effect.

In the figures, 1. high voltage blind flange socket; 2. high voltage plug; 3. upper clamping cover plate; 301. first semicircular groove; 302. exhaust pipe; 303. glue filling port; 304. first tapered groove; 4. lower clamping cover plate; 401. second semicircular groove; 402. second tapered groove; 403. cylinder; 5. compression collar; 6. compression nut; 7. high voltage cable; 8. feeder pillar; 9. insulating glue; 10. high pressure sealing plug; 11. first bolt; 12. second bolt; 13. flange; 14. seal ring; 15. pressing plate; 16. nut; 17. threaded rod.

DETAILED DESCRIPTION OF THE EMBODIMENTS

In order to make the purpose, technical solution and advantages of the present disclosure clearer, the present disclosure will be further described in detail below with reference to attached figures and embodiments. It should be understood that the preferred embodiment described herein is only to explain the present disclosure and are not intended to limit the present disclosure. Moreover, the technical characteristics involved in different embodiments of the present disclosure as described below can be combined together provided there is no discrepancy among them.

As shown in FIGS. 1a, 1b, 2, 3 and 4, an integrated feedthrough for high voltage cables of the present disclosure comprises a glue filling device and a high voltage feedthrough. In order to make the structure of the device simple and easy to operate, some identical components are used in the glue filling device and the high voltage feedthrough, i.e. both include a high voltage blind flange socket 1, a high voltage plug 2, a compression collar 5, a compression nut 6, an insulating glue 9 and a first bolt 11. To ensure that there is no gap inside during a high voltage feed, a high pressure channel inside a feeder pillar 8 is the same as a glue filling cavity formed by an upper and lower clamping cover plates, in terms of structure. The high voltage plug 2 and the high voltage cable 7 are insulated and sealed by the insulating glue 9 in the glue filling device, and taken out after the insulating glue 9 is allowed to stand for curing. High voltage is fed into vacuum through a high pressure channel inside of the feeder pillar 8, so as to avoid the occurrence of high voltage sparking.

Figure 1A:
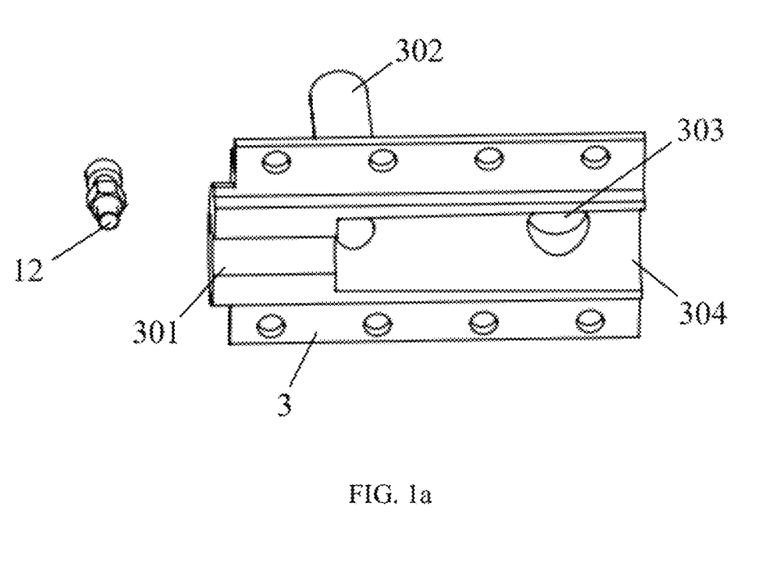
FIG. 1a is a schematic diagram of an upper clamping cover plate and a second bolt.
Figure 1B:
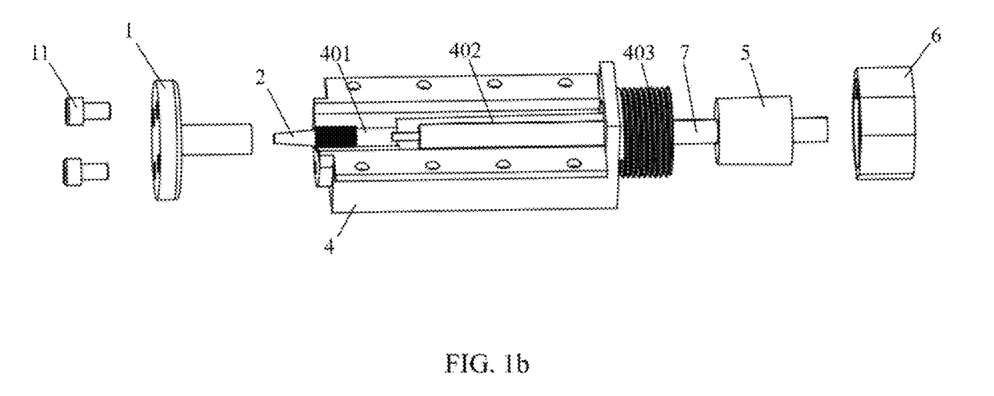
FIG. 1b is a schematic diagram of a lower clamping cover plate.
Figure 2:
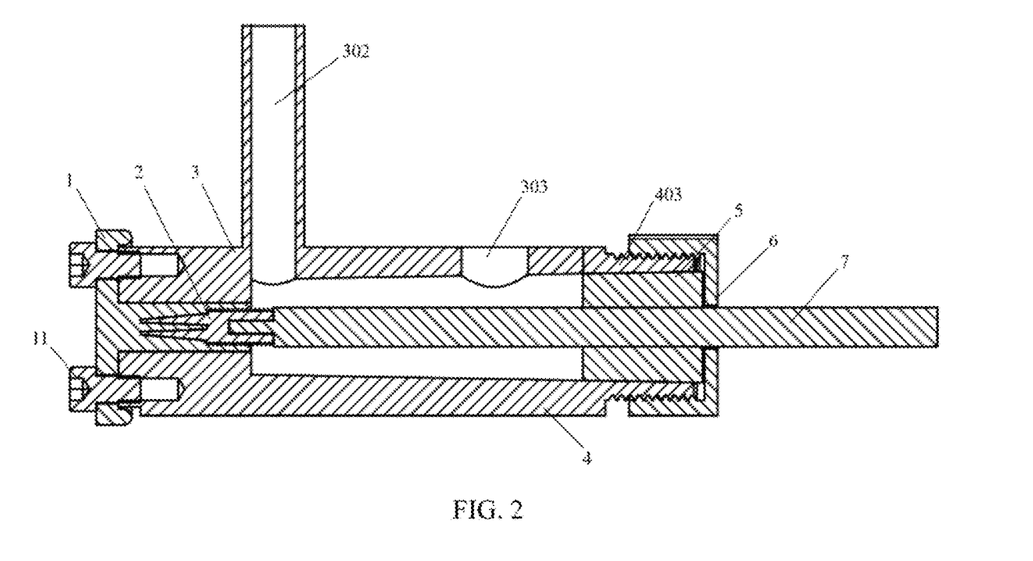
FIG. 2 is a schematic diagram illustrating installation of a glue filling device.

The glue filling device comprises a high voltage blind flange socket 1, a high voltage plug 2, an upper clamping cover plate 3, a lower clamping cover plate 4, a compression collar 5 and a compression nut 6. the upper clamping cover plate 3 and the lower clamping cover plate 4 are fastened and connected by a second bolt 12, and the glue filling cavity is arranged inside the two; the high voltage blind flange socket 1 cooperates with a tapered groove inside the high voltage plug 2 and a thread structure outside through a W-shaped groove and a thread structure inside to form a high voltage joint; a tail of the high voltage plug 2 is drilled with a circular hole slot, and the high voltage cable 7 is inserted into the circular hole slot and connected by tin soldering; the upper clamping cover plate 3 and the lower clamping cover plate 4 are respectively provided with a first semicircular groove 301, a first tapered groove 304, a second semicircular groove 401 and a second tapered groove 402; a cylinder 403 with a central hole is arranged at a tail of the lower clamping cover plate 4, threads are formed on an outer surface of the cylinder 403, and circular through holes are drilled inside to match with the compression collar 5, the compression nut 6 and the high voltage cable 7 to play a sealing role; the high voltage cable 7 passes through the cylinder 403 via the circular through hole of the cylinder 403, the compression collar 5 is sleeved on the high voltage cable 7 and enters the circular through hole of the cylinder 403, and the compression nut 6 compresses the compression collar 5; the first semicircular groove 301 and the second semicircular groove 401 at a front end of the glue filling cavity are in interference fit with the high voltage blind flange socket 1 and fastened by the first bolt 11, and a rear end of the glue filling cavity is matched with the high voltage cable 7 through the compression collar 5; the compression nut 6 is tightly fitted with threads outside the cylinder 403 at the tail of the lower clamping cover plate 4 for sealing, so as to prevent the insulating glue 9 in the glue filling cavity from overflowing when the glue is cured. The upper clamping cover plate 3 is provided with an exhaust pipe 302 at a position close to the high voltage blind flange socket 1, and the exhaust pipe 302 is communicated with the glue filling cavity; the upper clamping cover plate 3 is provided with a glue filling port 303, the glue filling port 303 is communicated with the glue filling cavity. The insulating glue 9 enters through the glue filling port 303 to achieve insulation and sealing of the high voltage plug 2 and the high voltage cable 7, and excessive insulating glue 9 and air inside are discharged from the exhaust pipe 302.

Preferably, the glue filling cavity is tapered and a diameter of one end close to the exhaust pipe 302 is smaller than that of the other end.

Preferably, the diameter of the circular through hole of the cylinder 403 is equal to that of a larger end of the glue filling cavity.

Figure 3:
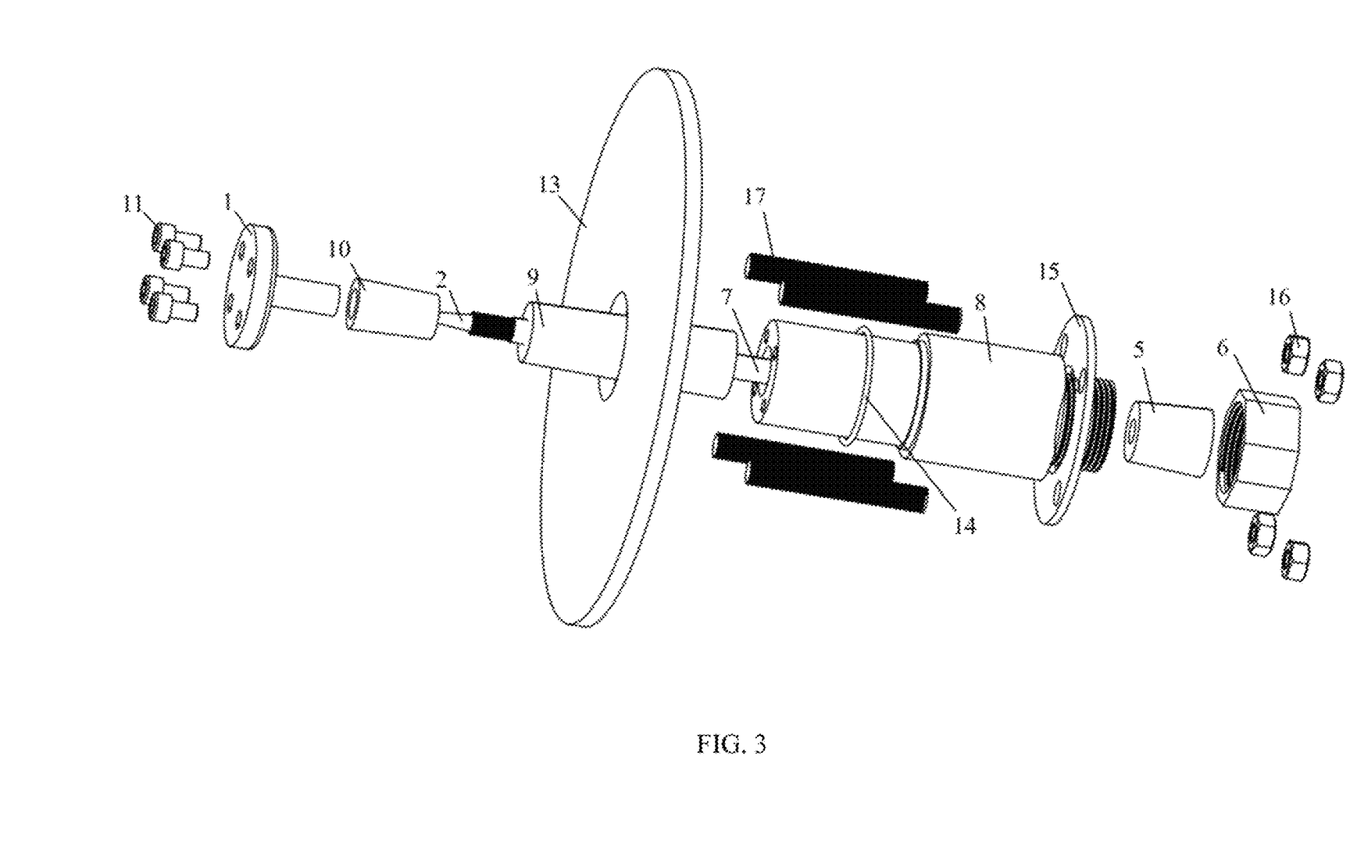
FIG. 3 is an overall schematic diagram of a high voltage feedthrough.

As shown in FIG. 3, the high voltage feedthrough comprises a feeder pillar 8. In order to ensure that there is no gap inside during high voltage feedthrough, the structure of the high pressure channel inside the feeder pillar 8 is the same as the structure of the glue filling cavity formed by the upper clamping cover plate 3 and the lower clamping cover plate 4. The high voltage feedthrough comprises a high voltage blind flange socket 1, a high voltage plug 2, a high voltage sealing plug 10, a high voltage cable 7, an insulating glue 9, a compression collar 5, a compression nut 6, a flange 13, a seal ring 14, threaded rods 17, a pressing plate 15 and nuts 16 in a coordinated manner. The high voltage blind flange socket 1, the high voltage plug 2, the high voltage sealing plug 10, the high voltage cable 7, the insulating glue 9, the compression collar 5 and the compression nut 6 are coaxially matched. Both the high voltage plug 2 and the high voltage cable 7 sealed by the insulating glue 9 are inserted into a tapered high pressure channel structure of the feeder pillar 8. Secondly, the high voltage sealing plug 10 and the high voltage blind flange socket 1 are matched with the high voltage plug 2 at an upper end of the feeder pillar 8, they are fastened by a first bolt 11. The compression collar 5 is matched with the high-voltage cable 7 at a tail of the feeder pillar 8, and the two are fastened by thread fitting between the compression nut 6 and the tail of the feeder pillar 8. The head of the feeder pillar 8 is fed into vacuum through the circular through hole of the flange 13, and the threaded rod 17 is first screwed with the threaded hole on the flange 13; then, a pressing plate 15 is used to pass through the threaded rod 17 and the tail of the feeder pillar 8, and then a nut 16 is used to fasten it with the threaded rod 17; the seal ring 14 between the flange 13 and the feeder pillar 8 is extruded to deform the seal ring 14, so as to seal the vacuum fed by the feeder pillar 8. After the high voltage plug 2 and the high voltage cable 7 are sealed with the insulating glue and allowed to stand for curing, they are fed into the vacuum through the feeder pillar 8. In FIG. 3, the insulating glue 9 is in a cured form.

After the insulating glue 9 is cured into a structure of the glue filling cavity, take out the high voltage plug 2, the high voltage cable 7 and the insulating glue 9, which are connected together, and put them into the high voltage feedthrough. With the compression nut 6 of the high voltage feedthrough being tightened, the compression collar 5 presses the cured insulating glue 9 for sealing.

Preferably, the lower clamping cover plate 4 is a rectangular block made of stainless steel with a length of 110 mm, a width of 35 mm and a height of 38 mm; a cylinder with a diameter of 37 mm and a depth of 5 mm is machined on the front end face, and M6 threaded holes are drilled at 14 mm from the center; when filling glue, the lower clamping cover plate 4 cooperates with the upper clamping cover plate 3 and the high voltage blind flange socket 1 to play a sealing role; a cylinder 403 with a length of 20 mm and a diameter of 31 mm is arranged on the rear end face thereof, a circular through hole is opened in the cylinder 403, and threads are machined on the outer surface of the cylinder 403; when filling glue, the lower clamping cover plate 4 cooperates with the compression collar 5 and the compression nut 6 to play a sealing role; an upper end face of the lower clamping cover plate 4 is provided with a 105 mm long inner concave stepped platform, such a structure is designed for closely fitting with the upper clamping cover plate 3; moreover, a second semicircular groove 401 with a diameter of 11 mm and a second tapered groove 402 with a length of 70 mm are machined in a middle area of the inner concave stepped platform, both the second semicircular groove 401 and the second tapered groove 402 are a lower cavity of the glue filling device, and further a tapered through hole is machined at the same axial position as a tail of the lower clamping cover plate 4. On both sides of the upper end face of the lower clamping cover plate 4, there are rectangular blocks with a length of 100 mm, a width of 10 mm and a thickness of 3 mm, on which 4 threaded clearance holes are opened at equal intervals.

Preferably, the upper clamping cover plate 3 is a rectangular block made of stainless steel; in order to match the size of the lower clamping cover plate 4, the upper clamping cover plate 3 has a length of 105 mm, a width of 35 mm and a height of 18 mm; a cylinder with a diameter of 37 mm and a depth of 5 mm is machined on the front end face, and M6 threaded holes are drilled at 14 mm from the center; when filling glue, the upper clamping cover plate 3 cooperates with the lower clamping cover plate 4 and the high voltage blind flange socket 1 to play a sealing role; a lower end face of the upper clamping cover plate 3 is provided with a 105 mm long outer convex stepped platform; such a structure is designed for closely fitting with the lower clamping cover plate 4; a first semicircular groove 301 with a diameter of 11 mm and a first tapered groove 304 with a length of 70 mm are machined in a middle area of the outer convex stepped platform, both the first semicircular groove 301 and the first tapered groove 304 are an upper cavity of the glue filling device; a rectangular block with a length of 100 mm, a width of 10 mm and a thickness of 3 mm is arranged on both sides of the lower end face of the upper clamping cover plate 3, and 4 threaded clearance holes are opened at equal intervals on it; moreover, two circular through holes with a diameter of 10 mm and 15 mm are drilled on the upper end face of the upper clamping cover plate 3; the circular through hole with a diameter of 10 mm is welded with a hollow steel pipe as an exhaust pipe 302 for exhausting air and discharging excessive insulating glue; the circular through hole with a diameter of 15 mm is used as a glue filling port 303 for the glue filling operation.

Preferably, the high voltage plug 2 is made of oxygen-free copper, with a conical head and a tapered groove in a central area of the head. A tail of the high voltage plug is machined with threads to be matched with the high voltage blind flange socket 1, while a circular hole slot is formed in a central area of the tail, and the high voltage cable 7 is inserted into the circular hole slot and connected by tin soldering.

Preferably, the high voltage blind flange socket 1 is a circular copper block made of oxygen-free copper material and provided with an annular wrapping, the annular wrapping and the circular copper block form a culture dish structure; of which, the bottom diameter is 37 mm, the width of the wrapping is 3.5 mm, the bottom thickness is 5 mm, and the thickness of the annular side wall is 8 mm; there is a cylindrical bulge with a height of 30 mm and a diameter of 11 mm in a central area of the bottom, and a W-shaped groove is opened in the central area of the cylindrical bulge; threads are machined at an entrance of the groove, the cylindrical bulge is closely matched with the high voltage plug 2 through the threads.

Preferably, the insulating glue 9 is Tianmu 701, and Tianmu 701 insulates and seals the high voltage plug and the high voltage cable 7 through the glue filling device. In order to ensure the stability of insulation, after sealing the high voltage plug 2 and the high voltage cable 7, Tianmu 701 needs to stand in the glue filling device for 7 days. After complete curing, take out the high voltage plug 2 and the high voltage cable 7 sealed by the insulating glue 9, and feed the high voltage cable 7 into vacuum through the feeder pillar 8.

Preferably, the compression collar 5 is a round table made of fluororubber material, and a circular through hole is drilled in a middle area;

Preferably, the compression nut 6 is made of stainless steel and has an L-shaped cross section;

To sum up, the upper clamping cover plate 3 and the lower clamping cover plate 4 of the glue filling device are fastened by the second bolt 12. The first semicircular groove 301 and the second semicircular groove 401 at the front end of the glue filling cavity are in interference fit with the high voltage blind flange socket 1 and fastened by the first bolt 11. The rear end of the glue filling cavity seals the high voltage cable 7 through the cooperation of the threads at the tail of the lower clamping cover plate 4, the compression collar 5 and the compression nut 6. In order to prevent the insulating glue 9 from overflowing when the filling glue is cured, the insulating glue 9 enters through the glue filling port 303, and excessive insulating glue 9 and air inside the insulating glue 9 are discharged from the exhaust pipe 302.

Preferably, the high pressure sealing plug 10 is a round table made of fluororubber material. The diameter of the upper end face of the high pressure sealing plug 10 is 12.76 mm, the diameter of the lower end face is 18.53 mm, and the height is 33 mm. A circular through hole with a diameter of 11 mm is drilled in the central area, which plays a role of insulation and sealing by closely matching with the high voltage blind flange socket 1.

Preferably, the feeder pillar 8 is made of polyether ether ketone (PEEK) material and the feeder pillar 8 has a stepped shaft shape as a whole to prevent high voltage creepage arc. A tapered high pressure channel is drilled inside the feeder pillar, and through the tapered high pressure channel, the high voltage cable 7 is fed into vacuum. The bottom thread of the feeder pillar 8 is matched with the compression collar 5, the compression nut 6 and the high voltage cable 7, and after being fastened by the compression nut 6, the compression collar 5 is extruded under pressure to fill up the bottom of the tapered high pressure channel, so as to seal the tapered high pressure channel; the upper end of the feeder pillar 8 is matched with a high voltage joint and a high pressure sealing plug 10, and the first bolt 11 is used to fasten the high pressure sealing plug 10 so that the tapered high pressure channel is filled up after being pressed by pressure, thus achieving a sealing effect. The upper and lower ends of the tapered high pressure channel are sealed in a cone shape, which can press the insulating glue 9 and the high voltage cable 7 tightly to avoid gaps inside the tapered high pressure channel and achieve a better insulation effect.

Figure 4:
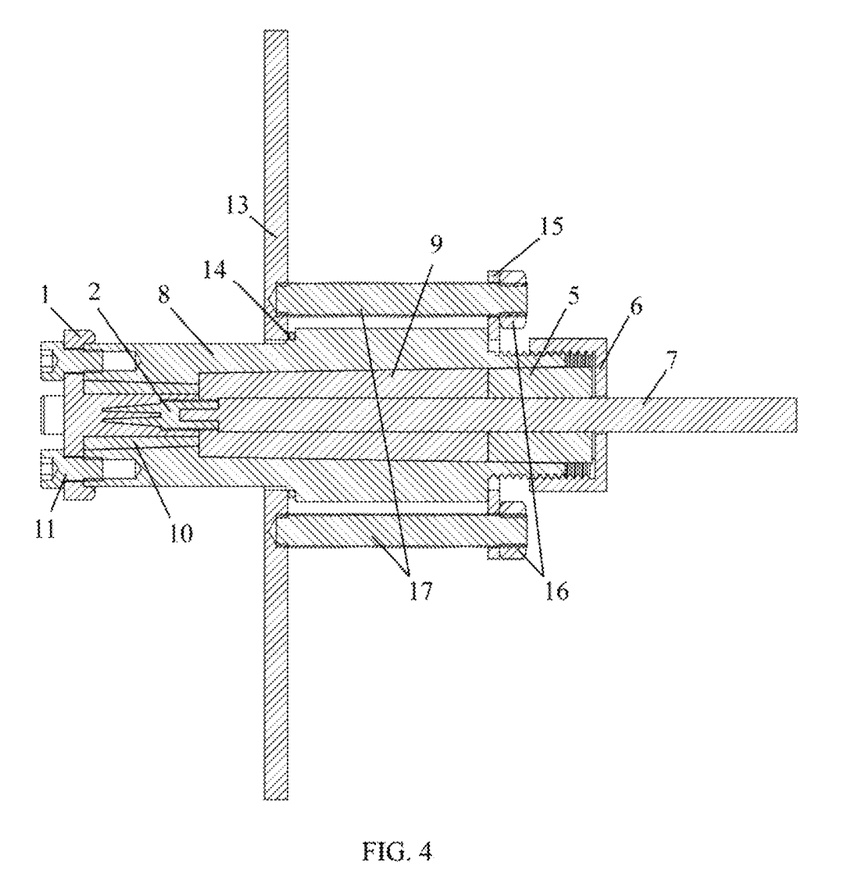
FIG. 4 is a schematic diagram illustrating installation of a high voltage feedthrough.

Preferably, the flange 13 is a circular block made of stainless steel, and a circular through hole with a diameter of 45 mm is formed at a center position of the flange 13, so that the feeder pillar 8 can be fed into vacuum through the circular through hole, and M8 threaded holes are drilled around the circular through hole and circumferentially distributed.

Preferably, the seal ring 14 is made of fluororubber material and has an O-shaped cross section.

Preferably, the pressing plate 15 is a circular block made of PEEK material, and a circular through hole with a diameter of 39 mm is drilled at a center position of the pressing plate 15 so that a tail of the feeder pillar 8 can pass through it; through holes with a diameter of 9 mm are drilled on an edge of the pressing plate 15 and circumferentially distributed so that the threaded rod 17 can pass through it.

Preferably, the threaded rod 17 is made of PEEK material. By fitting with the threaded holes on the flange 13 and the pressing plate 15, and tightening nuts 16 to extrude the seal ring 14 between the flange 13 and the feeder pillar 8 to generate deformation, so as to seal with the vacuum fed in by the feeder pillar 8.

What is claimed is:

1. An integrated feedthrough for high voltage cables, comprising a glue filling device and a high voltage feedthrough:

wherein the glue filling device comprises a lower clamping cover plate, an upper clamping cover plate, a compression collar, a compression nut, a high voltage plug, a high voltage blind flange socket and a high voltage cable in a coordinated manner; the upper clamping cover plate and the lower clamping cover plate are connected by a second bolt, and a glue filling cavity is formed inside; the high voltage blind flange socket cooperates with a tapered groove inside the high voltage plug and a thread structure outside through a W-shaped groove and a thread structure inside to form a high voltage joint; the glue filling cavity cooperates with the high voltage joint, the compression collar and the compression nut to seal both front and rear ends of the glue filling cavity to prevent an insulating glue from overflowing; after the insulating glue is allowed to stand for curing, the high voltage plug and the high voltage cable sealed by the insulating glue are taken out; and the high voltage feedthrough comprises a feeder pillar, a high voltage sealing plug, a flange, a seal ring, threaded rods, a pressing plate and nuts in a coordinated manner; both the high voltage plug and the high voltage cable sealed by the insulating glue are inserted into a tapered high pressure channel structure of the feeder pillar; the high voltage sealing plug and the high voltage blind flange socket are matched with the high voltage plug at an upper end of the feeder pillar, they are fastened by a first bolt; the compression collar is matched with the high voltage cable at a tail of the feeder pillar, and the two are fastened by thread fitting between the compression nut and the tail of the feeder pillar; the flange is matched with the feeder pillar, the two are fastened by the threaded rods, a pressing plate and nuts, and a seal ring between the flange and the feeder pillar is extruded to deform the seal ring and seal the vacuum fed by the feeder pillar; high voltage is fed into the target through the high voltage feedthrough to realize insulation and sealing of the high voltage plug and avoid high voltage sparking.

2. The integrated feedthrough for high voltage cables according to claim 1, wherein the upper clamping cover plate and the lower clamping cover plate are made of stainless steel; the front ends of the upper clamping cover plate and the lower clamping cover plate are arranged with cylinders and drilled with two symmetrical threaded holes; a semicircular groove and a tapered groove are formed inside the upper clamping cover plate and the lower clamping cover plate, and the semicircular groove and the tapered groove form the glue filling cavity; the upper clamping cover plate and the lower clamping cover plate are connected by a second bolt; the two symmetrical threaded holes are arranged on an upper end face of the upper clamping cover plate, one of the symmetrical threaded holes is configured to exhaust air and discharge excessive insulating glue, and the other of the symmetrical threaded holes is configured to perform a glue filling operation; a rear end of the lower clamping cover plate is provided with a rear cylinder; a hole is opened in the rear cylinder, and threads are arranged on an outer surface of the rear cylinder; when the glue filling operation is performed, the upper clamping cover plate and the lower clamping cover plate cooperate with the high voltage joint, the compression collar, compression nut and high voltage cable to play a sealing role.

3. The integrated feedthrough for high voltage cables according to claim 1, wherein the compression collar is a round table made of fluororubber material, and a circular through hole is drilled in a middle area to let the high voltage cable pass through and be put into a corresponding groove; and the compression collar fills the groove to form a seal upon being extruded by pressure.

4. The integrated feedthrough for high voltage cables according to claim 1, wherein the compression nut is made of stainless steel and has an L-shaped cross section.

5. The integrated feedthrough for high voltage cables according to claim 1, wherein the high voltage plug is made of oxygen-free copper, with a conical head and a tapered groove in a central area of the head; a tail of the high voltage plug is formed with threads to be matched with the high voltage blind flange socket, while a circular hole slot is formed in a central area of the tail, and the high voltage cable is inserted into the circular hole slot and connected by tin soldering.

6. The integrated feedthrough for high voltage cables according to claim 1, wherein the high voltage blind flange socket is a circular copper block made of oxygen-free copper and provided with an annular wrapping, the annular wrapping and the circular copper block form a culture dish structure; a cylindrical bulge is arranged in a central area at a bottom of the circular copper block, a W-shaped groove is opened in a central area of the cylindrical bulge, and threads are formed at an entrance of the W-shaped groove.

7. The integrated feedthrough for high voltage cables according to claim 1, wherein the insulating glue insulates and seals the high voltage plug and the high voltage cable through the glue filling device.

8. The integrated feedthrough for high voltage cables according to claim 2, wherein a front end of the glue filling cavity is in interference fit with the high voltage joint, the compression collar is matched with the high voltage cable at a rear end of the glue filling cavity, and the two are fastened by thread fitting between the compression nut and a rear end of the lower clamping cover plate; the compression collar being extruded under pressure forms a conical seal.

9. The integrated feedthrough for high voltage cables according to claim 1, wherein the feeder pillar is made of a polyether ether ketone (PEEK) material and the feeder pillar has a stepped shaft shape as a whole to prevent high voltage creepage arc; a tapered high pressure channel is drilled inside the feeder pillar, and through the tapered high pressure channel, the high voltage cable is fed into vacuum, and both ends of the tapered high pressure channel are sealed by taper compression.

10. The integrated feedthrough for high voltage cables according to claim 9, wherein the high voltage joint and the high voltage cable are taken out from the glue filling device after being sealed with the insulating glue and allowed to stand for curing.

11. The integrated feedthrough for high voltage cables according to claim 1, wherein the flange is a circular block made of stainless steel, and a circular through hole is formed at a center position of the flange, so that the feeder pillar can be fed into vacuum through the circular through hole, and threaded holes are drilled around the circular through hole and circumferentially distributed.

12. The integrated feedthrough for high voltage cables according to claim 1, wherein the seal ring is made of fluororubber material and has an O-shaped cross section.

13. The integrated feedthrough for high voltage cables according to claim 1, wherein the pressing plate is a circular block made of PEEK material, and a circular through hole is formed at a center position of the pressing plate so that a tail of the feeder pillar can pass through it; through holes are drilled on an edge of the pressing plate and circumferentially distributed so that the threaded rod can pass through it.

14. The integrated feedthrough for high voltage cables according to claim 1, wherein the threaded rod is made of PEEK material, and by fitting with the threaded holes on the flange and the pressing plate, and tightening nuts to extrude the seal ring between the flange and the feeder pillar to generate deformation, so as to seal with the vacuum fed in by the feeder pillar.

* * * * *